United States Patent [19]

Kaschke

[11] Patent Number: 5,128,834

[45] Date of Patent: Jul. 7, 1992

[54] SURFACE MOUNT RECEPTACLE FOR LEADED COMPONENTS

[75] Inventor: Kevin D. Kaschke, Palatine, Ill.

[73] Assignee: Motorola, Inc., Schaumburg, Ill.

[21] Appl. No.: 569,312

[22] Filed: Aug. 20, 1990

[51] Int. Cl.⁵ .............................................. H05K 7/12
[52] U.S. Cl. .................... 361/417; 361/400; 335/202
[58] Field of Search ............... 361/417, 418, 419, 420, 361/400, 403, 423, 427; 335/199, 202, 151, 152, 154; 336/192, 228; 337/297; 338/197, 315

[56] References Cited

U.S. PATENT DOCUMENTS

| | | | |
|---|---|---|---|
| 3,302,143 | 1/1967 | Harkenrider | 335/151 |
| 3,940,722 | 2/1976 | Fox et al. | 335/151 |
| 4,136,321 | 1/1979 | Smith | 335/151 |
| 4,177,439 | 12/1979 | Smith | 335/151 |
| 4,495,480 | 1/1985 | Martin et al. | 361/419 X |
| 4,695,927 | 9/1987 | Barre | 361/417 X |
| 4,884,053 | 11/1989 | Bougger | 361/417 X |

Primary Examiner—Leo P. Picard
Assistant Examiner—Paramita Ghosh
Attorney, Agent, or Firm—Kevin D. Kaschke; Rolland R. Hackbart; Kenneth W. Bolvin

[57] ABSTRACT

A leaded electrical component 101 for surface mount applications having a receptacle 107 attached to the component 101 which renders the resultant assembly 127 capable of mounting to the top surface of the substrate 129. The top of the receptacle 111 provides an opaque, smooth surface enabling the assembly to be picked up and placed using automatic equipment with a vision system. The bottom of the receptacle 113 rests on the top surface of the substrate 129 to provide stability for the surface mount assembly 127. The receptacle 107 captures the component 101 in a secure position. The captured component 101 provides a specific orientation until the leads 109 are coupled to the substrate.

13 Claims, 2 Drawing Sheets

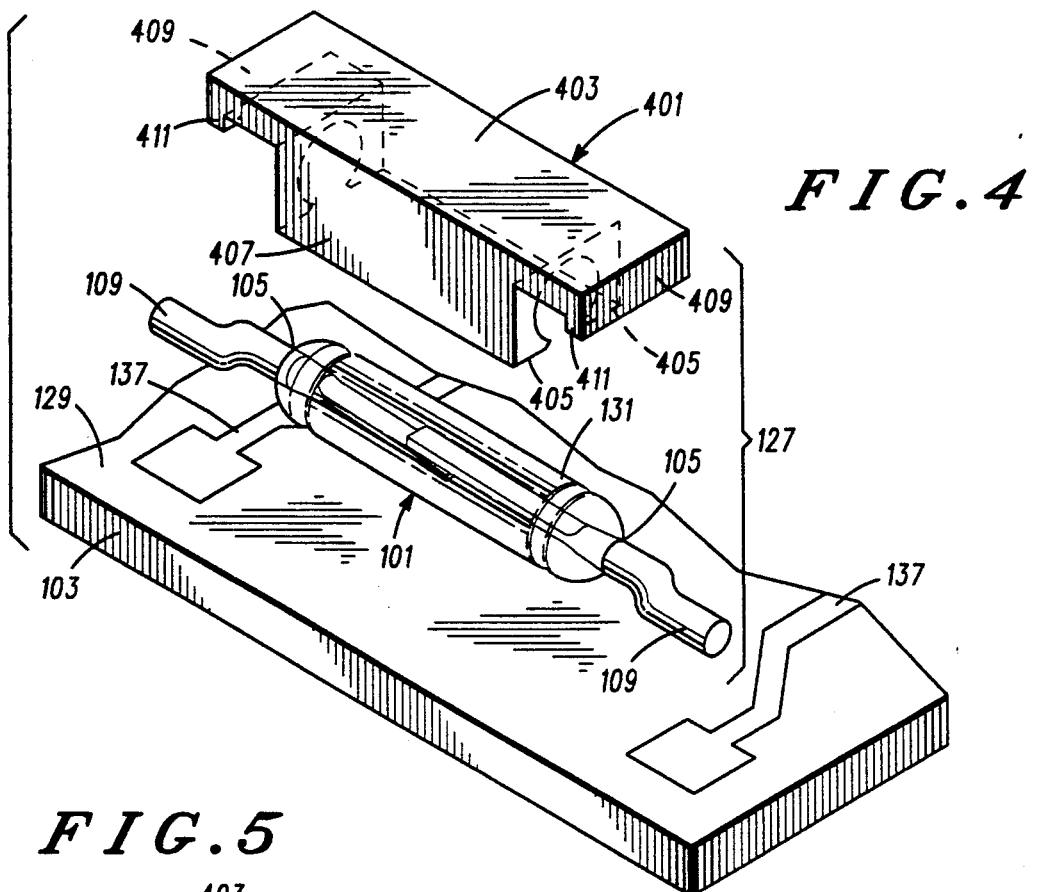
FIG. 4
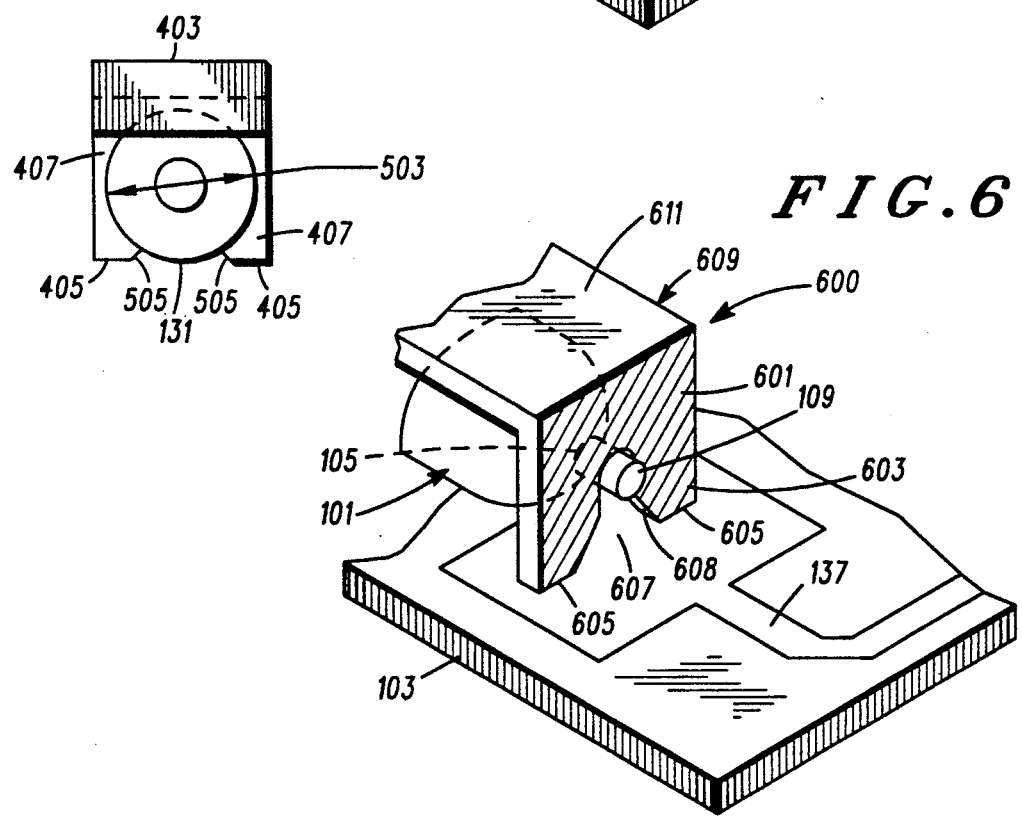
FIG. 5
FIG. 6

SURFACE MOUNT RECEPTACLE FOR LEADED COMPONENTS

FIELD OF THE INVENTION

This invention relates generally to the field of electrical components.

This invention is more particularly concerned with leaded electrical components such as a reed switch for use in surface mount applications.

BACKGROUND OF THE INVENTION

Hybrid and printed circuit technologies have existed for many years, however the trend in electronics is toward surface mount manufacturing. Surface mounted components are rapidly taking the place of conventional through hole mounted components for many applications because of the more compact arrangement and the ease of automated mounting that is possible with such components. Surface mounted components differ from through hole components in that the leads of a surface mount component are attached to the surface of the mounting substrate rather than protruding through the substrate as with through hole component leads. In recent years, many leaded electrical devices originally designed for through hole mounting to a substrate have been adapted or redesigned for surface mount capability.

Manufacturers and designers have been slow to develop a surface mount concept for one particular electromagnetic device called a reed switch. A reed switch uses glass enclosed, magnetically closed reeds as the contact members. The reed contacts internal to the glass extend outside opposite ends of the glass to form the leads of the device. Typically, the glass is in the shape of a cylindrical tube whereby the ends of the tube are hermetically sealed around the leads. The reeds contact each other to form a short circuit when the reed switch is placed within a sufficient magnetic field. One advantage of using a reed switch is its wireless activation by a magnetic field. Typical applications for a reed switch include proximity sensors.

The reed switch has not been readily available as a surface mountable component due to the construction of reed switch. Manufacturers of reed switches utilize the tubular nature of the glass in order to hermetically seal the glass around the cylindrical metal leads. This critical step in the reed switch manufacturing process is a result of many years of research and development. Several problems exist with trying to use a reed switch in a surface mount application. Reed switches are difficult to pick up using automatic pick and place equipment with a vision system. A vision system uses a camera to visually locate the profile of the part rather than relying on mechanical alignment. Since the reed switch body is glass, light refracting through the body makes it difficult for the vision system to define the silhouette of the part. Thus if the vision system cannot define the location of the reed switch, it cannot pick up the reed switch. Reed switches are also difficult to pick up since the cylindrical glass body is more fragile and larger than most other axial components. Another problem is that axial leads of the reed switch are not generally formed for an electrical connection to a surface mount substrate. Another problem is that the cylindrical body of the reed switch does not define an orientation for stabilizing the reed switch on the substrate. Even if the reed switch leads were formed for surface mount capability, it could roll over during handling before it gets permanently attached to the substrate. Still another problem is that the hermetic seal on the reed switch is sensitive to stresses on the lead that can break the hermetic seal. Thermal and mechanical stresses can cause the substrate to stress the leads of the reed switch.

One method which has been used to counter these problems is to mold a permanent case around the body of the reed switch. This method mounts the reed switch leads to a lead frame. The reed switch/lead frame combination is then placed in a tooling cavity in which a material is injection molded around the combination to form a pretooled shape. Although this method solves the above problems, it requires a great deal of expertise on the part of the tool makers in order that the injection flow of the material during the molding process does not damage the glass body of the reed switch. The case design and material must be carefully determined so that the glass body of the reed switch is not damaged during the thermal stresses of the operating environment of the reed switch assembly. This assembly also typically costs two to five times the solution presented by the preferred embodiment.

Others have approached the problem of surface mounting a reed switch by potting the reed switch in a plastic shell. The reed switch is placed in the plastic shell and the liquid potting material is poured into the shell. Once the potting material has cured in the shell, the reed switch leads are formed for surface mount capability. The problems with this approach include the lengthy cure time to set the potting material and the resulting high cost of the assembly.

One reed switch manufacture took the approach of designing a reed switch with a rectangular glass tube instead of a cylindrical glass tube. The leads are flat instead of round. This design is unconventional in the reed switch processing field. Although this design is effective in a surface mount application it is difficult to place using automatic pick and place with a vision system. Furthermore, from the standpoint of a buyer of surface mount reed switches, all other manufacturers have a cylindrical glass design which is difficult to use for the reasons described above.

Another method used for surface mounting a reed switch is to manually form its leads, place it on the substrate and attach it to the substrate. While this method results in a low cost surface mount reed switch, the labor and time required for this operation makes this method undesirable. This method also encourages a damaged hermetic seal in handling and the operating environment.

Therefore, there remains a need for a surface mount reed switch that can be automatically picked up and placed on a substrate, stabilized on the substrate, mounted on the substrate, buffered from the thermal and mechanical stresses on the hermetic seal and an inexpensive assembly.

SUMMARY OF THE INVENTION

An apparatus is provided for buffering stress induced on an end of a lead exiting a body of a component. A hollow receptacle defines a volume of space for encompassing the body and has a side of a predetermined thickness. An aperture is disposed through the predetermined thickness and has a portion of the lead between the end and the body disposed therein. A portion of the side is deformed, responsive to the application of an energy source means, to capture the portion of the lead within the aperture thereby buffering stress induced on the end of the lead.

According to a preferred embodiment of the present invention, the energy source means provides ultrasonic energy as supplied by an ultrasonic horn or the like. The receptacle is made from thermoplastic material whereby the portion of the side of the receptacle is deformed responsive to the application of the ultrasonic energy to capture the portion of the lead within the aperture.

BRIEF DESCRIPTION OF THE DRAWINGS

FIG. 4 is an exploded view of an alternate embodiment of the present invention and its application to a printed circuit substrate.

FIG. 5 is an end view of an alternate embodiment of the present invention.

FIG. 6 is a perspective view of one end of another alternate embodiment of the present invention.

DETAILED DESCRIPTION OF THE PREFERRED EMBODIMENT

Figure 1:
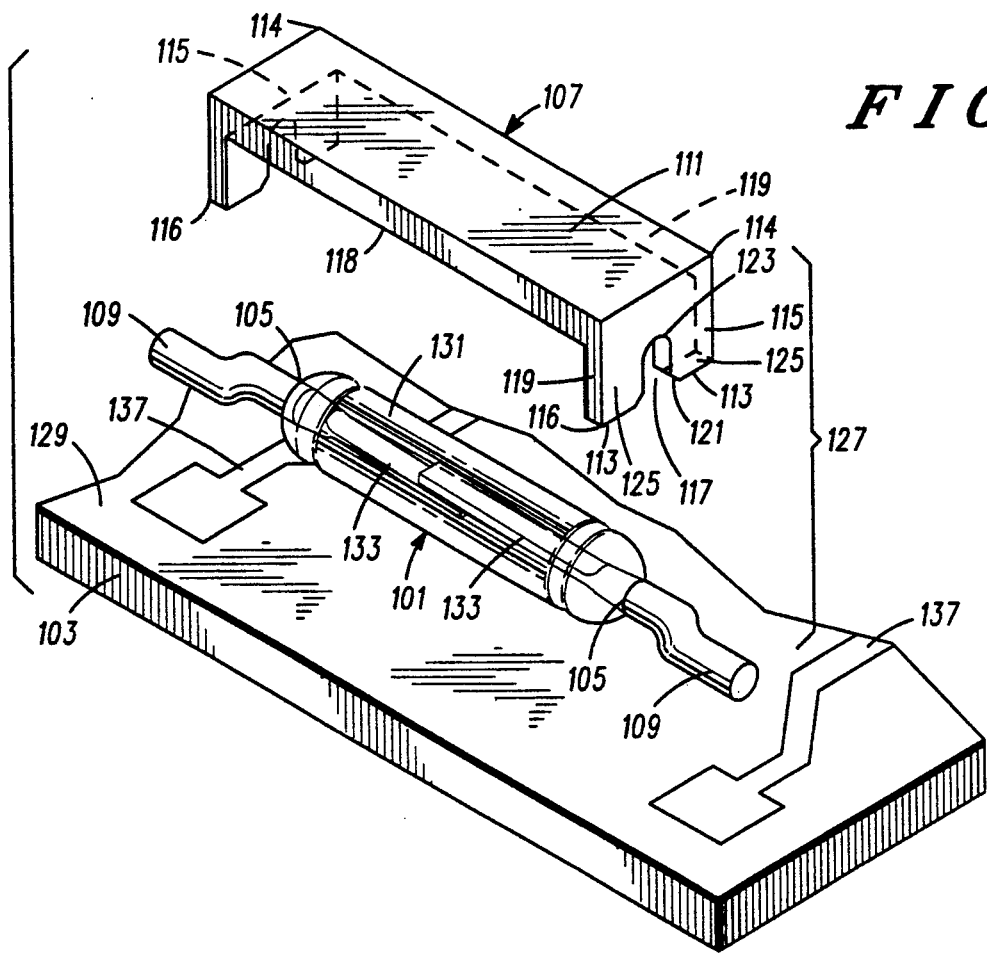
FIG. 1 is an exploded view of the preferred embodiment of the present invention and its application to a printed circuit substrate.

FIG. 1 shows an exploded view of the preferred embodiment of the present invention in its environment. Problems that exist with surface mounting a reed switch 101 comprise: robotic pick and placement using a vision system, stabilization on the substrate 103, mounting on the substrate 103, thermal and mechanical stresses on the hermetic seal 105 and an expensive component. The preferred embodiment solves these problems by securely attaching a receptacle 107 to the reed switch 101 and forming the leads of the reed switch 109.

The preferred embodiment describes a receptacle 107 molded from an electrically nonconductive material which provides a housing that covers the reed switch 101 on certain sides but not all sides. The molded material may be a thermoplastic material such as Vectra A-130 available from Hoechst Celanese Corporation. Thermoplastic materials have characteristics which allow it to flow when ultrasonic energy is applied and reform after ultrasonic energy is removed. Thermoplastic material also has a fast molding cycle time. The receptacle 107 construction may be a skeleton design to minimize the molding material and molding cycle time. The receptacle 107 is inexpensive because it is small, minimizes material and has a fast molding cycle time.

Thermoplastic material is usually opaque. An opaque receptacle allows a vision system to locate and register the top side of the receptacle 111. The opaque material creates a silhouette when the receptacle 107 is between the camera and the background light. The silhouette appears as a black rectangle having dimensions of the top side of the receptacle 111. The vision system compares the size of the silhouette of the receptacle 107 and compares it to an expected size of the receptacle 107 stored in the system's memory. If there is a match between the visual size and the expected size within a specified tolerance, a vacuum nozzle picks up the receptacle 107.

In the preferred embodiment, the receptacle 107 is rectangular shaped with a third top side 111, a first bottom surface 113, and first and second end sides 115. The two end sides 115 are essentially the same. The top side 111 and the two end sides 115 have a predetermined thickness. Surfaces are disposed on the top side 111 and the two end sides 115. Portions are disposed on the surface of each side. Portions are designated as a part of the surface of a side. The top side 111 is opposite and parallel to the bottom surface 113. Each end side is joined to each short dimension of the top side, respectively, to form edges 114. The top side 111 is essentially perpendicular to the two end sides 115. The bottom surface 113 is joined to the each end side 115 at an edge 116 opposite the edge 114 joined to the top side 111. The inner surface 118 of the top side 111 and two end sides 115 form a boundary for a volume of space which surrounds the body of the reed switch 101.

The top side 111 allows easy robotic pick and placement using a vacuum nozzle. Robotic pick and placement machines using a vacuum nozzle are common tools used to mount components to the surface of a substrate 129. The top side 111 is essentially smooth within the tolerance of molding industry standards and the ability of a vacuum nozzle tool to pick up the receptacle 107. Some vacuum nozzles are designed to pick up components with a flat surface and others are designed to pick up components with a curved surface. The top side 111 may also be designed with a radius similar to that of the reed switch 101 without departing from the spirit or scope of the present invention.

Each opposite and parallel end sides 115 contains an aperture 117 which is open to the bottom side 113 of the receptacle 113 and closed to the other three sides 111,119,119. The aperture 117 receives and captivates the leads of the reed switch 109. The aperture 117 begins with a "V" shaped slot 121. The "V" shaped slot 121 allows easy placement of the reed switch leads 109 into the aperture 117. The aperture 117 then continues into a "U" shaped slot 123. The "U" shaped slot 123 locates the reed switch 101 into its desired position within the receptacle 107. Once positioned within the aperture 117, the reed switch leads 109 are now ready to be captivated by the receptacle 107. The depth of the aperture 117 allows the reed switch 101 to be encompassed by the inner surface of the receptacle 118 such that the bottom surface of the receptacle 113 may rest on the top surface of the substrate 129. The aperture 117 divides each end side 115 into two connected portions thereby creating a supporting member 125 on each side of the aperture 117. The bottom surface 113 of the four supporting members 125, one on each corner of the receptacle 107, provide stability for the surface mount reed switch 127 on the top surface of the substrate 129.

The reed switch 101 shown in FIG. 1 comprises a cylindrical glass body 131 encompassing two magnetic reeds 133. The magnetic reeds 133 exit at opposite ends of the cylindrical glass body 131. The glass body 131 is hermetically sealed around each lead 109. This glass to metal interface 105 is sensitive to thermal and mechanical stresses on the leads of the reed switch 109. Excessive stresses on the leads of the reed switch 109 may produce cracks or chips in the glass body 131 along the lead 109 at the seal 105 which causes the seal 105 to lose its hermetic properties thereby damaging the reed switch 101. It is an important feature of the preferred embodiment that the reed switch lead 109 may be captured with the receptacle 107 between the hermetic seal 105 and the end of the lead 109 coupled to the electrically conductive pattern 137 on the substrate 103 thereby buffering the hermetic seal 105 from any thermal and mechanical stresses on the lead 109.

The reed switch leads 109 are formed into a conventional "gull wing" shape. This lead configuration couples the lead 109 from its axial position exiting the reed switch body 131 to a conductive pattern 137 on the surface of the substrate 129. Since the leads 109 are captivated by the receptacle 107, the reed switch 101 cannot rotate within the receptacle 107 thereby maintaining the correct orientation of the leads 109 to the conductive pattern 137. Other conventional lead forming shapes such as a "J" or "butt" lead (not shown) for surface mounting components may be used without affecting the spirit or scope of the present invention The preferred embodiment of the present invention uses a printed circuit board as the substrate 103. The printed circuit board 103 is of a conventional material such as FR4 epoxy glass, and has a conductive pattern 137 which carries electrical signals as well as providing a point of attachment between the surface mount reed switch 127 and the mounting substrate 103.

Figure 2:
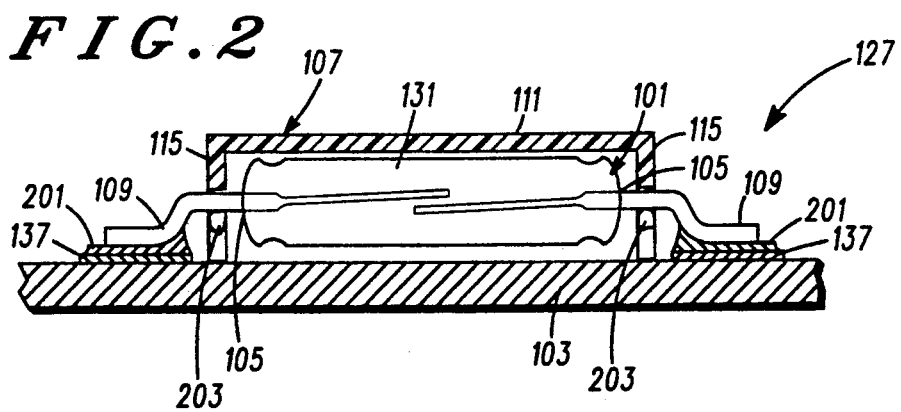
FIG. 2 is a cross sectional view of the preferred embodiment of the present invention wherein the invention is coupled to the surface of a printed surface substrate.

Now referring to FIG. 2, there is shown a cross sectional view of the preferred embodiment of the present invention surface mounted to a printed circuit substrate 103. The reed switch 101 has been converted to a surface mount reed switch 127 by securely attaching a receptacle 107 to the reed switch 101 and forming the leads of the reed switch 109 into a gull wing shape. The receptacle 107 encompasses the reed switch 101 on the top side 111 and two end sides 115. The receptacle 107 stabilizes the reed switch 101 on the substrate 103 until the reed switch leads 109 are securely coupled to the substrate 103. The reed switch leads 109 are securely fastened to the substrate 103 using conventional reflow soldering techniques. Reflow soldering processes may use either infra red wavelength or vapor phase gas to heat the solder 201 to its melting point thereby joining the reed switch leads 109 to the electrically conductive pads 137.

The receptacle 107 is attached to each lead of the reed switch 109 near the glass body 131 of the reed switch 101. Attaching the receptacle 107 to the leads of the reed switch 109 serves three purposes: coupling the receptacle 107 to the reed switch 101, securing the reed switch 101 in a fixed orientation and buffering the hermetic seals 105 from stresses on the leads 109.

The reed switch leads 109 are captured with displaced material 203 from the receptacle 107. This assembly process is called swaging or forming. The preferred embodiment uses ultrasonic energy to swage the material 203 of the receptacle 107 over the leads 109. Ultrasonic assembly is a fast, clean, efficient method of assembling rigid thermoplastic parts. Ultrasonic assembly equipment converts 50/60 Hz current to 20 kHz or 40 kHz electrical energy through a solid state power supply. This high frequency energy is supplied to the converter, a component that changes electrical energy into mechanical vibratory energy at ultrasonic frequencies. The vibratory energy is then transmitted through an amplitude modifying device called a booster to the horn. The horn is an acoustic tool that transfers this vibratory energy directly to the parts being assembled. The use of ultrasonic energy requires that the receptacle 107 be molded out of a thermoplastic material.

The thermoplastic properties allows the material to melt when ultrasonic energy is applied and then reform when the ultrasonic energy is removed. The displaced material 203 flows on and around the leads 109 of the reed switch 101 thereby mechanically capturing the leads 109. The reed switch leads 109 are not able to rotate thereby maintaining the lead form orientation in contact with the solder 201 on the conductive pattern 137. Since the leads 109 are captured, the hermetic seal 105 is buffered from any thermal or mechanical stress on the reed switch leads 109.

Specific methods and machines regarding the use of ultrasonic energy to displace material 203 around the leads of the reed switch 109 are generally known to the ultrasonic process industry. Other methods of displacing material 203 from the receptacle 107 around the leads of the reed switch 109 will be apparent to one skilled in the art without departing from the spirit and scope of the present invention. One such alternative may utilize a heat staking process which melts a portion of the receptacle 107 thereby securing it to the reed switch leads 109.

Figure 3:
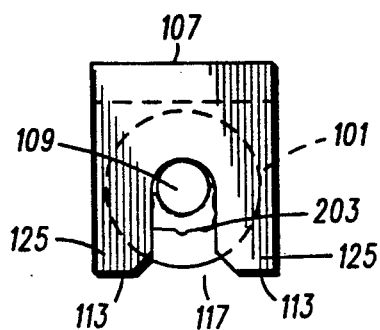
FIG. 3 is a cross sectional view of one end of the preferred embodiment of the present invention.

Now referring to FIG. 3, there is shown a cross sectional view of one end of the preferred embodiment of the present invention. After the reed switch 101 is placed in the receptacle 107, an ultrasonic horn (not shown) enters the aperture 117 open to the bottom of the receptacle 113 and swages material 203 from the area around the aperture 117 over the lead 109. This operation would be performed with the supporting members 125 of the receptacle 107 facing upward so that gravity may hold the reed switch in place during the ultrasonic swaging operation. The displaced material 203 flows when energy is applied to the ultrasonic horn and reforms when energy is removed from the ultrasonic horn. The reed switch lead 109 is thereby mechanically captured by displacing material 203 from the aperture 117 over the reed switch leads 109.

Referring now to FIG. 4, there is shown an exploded view of an alternate embodiment of the present invention in its environment. The alternate embodiment employs a molded receptacle 401 which provides a housing that covers the reed switch 101 on certain sides but not all sides. The receptacle has a top 403, a bottom 405, two long sides 407 and two short sides 409. The top side 403 is opposite and parallel to the bottom side 405 The short sides 409 are opposite and parallel to each other. The long sides 407 are opposite and parallel to each other. The top side 403 allows easy robotic pick and placement using a vacuum nozzle (not shown). The material used for molding the receptacle 401 is opaque so that a vision system may be used for robotically picking and placing the surface mounted switch 127 on the substrate 103. The receptacle 401 is attached to the reed switch 101 by deflecting the two long sides 407 of the receptacle 401 around the glass body 131 of the reed switch 101. The receptacle dimensions and material are chosen using well known design techniques in the molding industry. The bottom of the long sides 407 make up the bottom of the receptacle 405. This bottom side 405 interfaces the top surface of substrate 129 to provide stability for the reed switch 101 until it is securely coupled to the conductive pattern 137. The two short sides 409 of the receptacle comprise a ledge 411 which centers the reed switch body 131 within the receptacle 401 along the axis of the reed switch leads 109. The ledge 411 is even with the top side of the receptacle 403 and extends downward toward the reed switch leads 109 but does not touch the leads 109. This eliminates any mechanical stresses on the hermetic seals 105 at each end of the reed switch 101 when the reed switch body 131 is captured by the receptacle 407.

After the reed switch 101 is captured by the receptacle 401, the leads 109 are formed into a conventional "gull wing" shape. The friction of an interference fit between the receptacle and reed switch body 131 provides a specific orientation for coupling the leads 109 to the conductive pattern 137 on the surface of the substrate 129. As discussed above, other lead forming shapes may be used for surface mounting components may be used without affecting the scope of the present invention. The substrate 103 may also be a printed circuit board as discussed in the preferred embodiment.

Now referring to FIG. 5, there is shown an end view of the alternate embodiment of the present invention. The reed switch lead form has been deleted to simplify the figure. This view clearly illustrates the capturing mechanism. The diameter 503 of the inside surface of the long sides 407 and the top side 403 is smaller than the reed switch body 131 to create an interference fit. A bevelled surface 505 is between the bottom of the long sides 405 and the inside surface diameter of the receptacle 503. The bevelled surface 505 centers the reed switch body 131 in the receptacle. The long sides of the receptacle 407 deflect outward when pressure is applied the the reed switch body 131. When at least half of the reed switch body 131 has traveled beyond the bevelled surface 505, the long sides 407 retreat to their original position to capture the reed switch body 131. Depending on the tolerances involving the reed switch body 131 and inside diameter of the receptacle 503, the receptacle may be molded out of a plastic, rubber or a combination of the two materials to maintain an interference fit. The bottom on the long sides 405 provide stability for the reed switch body 131 on the substrate (not shown). The design requirements needed to create a deflecting wall for the two long sides 407 are well known to the molding and materials industry. Variations on this alternate embodiment may be made without departing from the spirit or scope of the present invention.

Now referring to FIG. 6, there is shown a perspective view of one end of still another embodiment of the present invention. The second opposite and parallel end side (not shown) has the same features as the end shown in FIG. 6. This receptacle design produces a leadless surface mount reed switch 600. An electrically conductive layer 601 is coupled to the end side 603, the bottom side 605 and the aperture's surface 608 of the receptacle 609. The purpose of the conductive layer 601 is to couple an electrical signal from the reed switch lead 109 to the conductive pattern 137 on the mounting substrate 103 and to mechanically couple the receptacle 609 to the electrically conductive pattern 137 on the mounting substrate 103. The reed switch lead 109 is a stub long enough to project through the end side of the receptacle 603 after the reed switch 101 is placed within the receptacle 609. The lead 109 may be coupled to conductive layer 601 on the surface of the aperture 607 using solder (not shown). Since the leads 109 are not directly coupled to the substrate 103, the thermal and mechanical stresses on the hermetic seal 105 are greatly reduced. Advantages of this embodiment include: a short distance between conductive pads on the substrate yielding a dense component arrangement and eliminating the lead forming operation.

Other methods of coupling the reed switch leads 109 to the conductive layer 601, such as an interference fit may be used instead of solder. Selecting, adding, or eliminating coverage of the conductive layer on any surface of the receptacle 609 may be done to couple the electrical signals from the reed switch lead 109 to the conductive pattern on the substrate 137 and to mechanically couple the receptacle 609 to the conductive pattern 137 on the substrate 103. The end sides of the receptacle 603 may also be constructed with a solid conductive material rather than a conductive layer 601 over a nonconductive material. This configuration requires that the top side 611 consist of a nonconductive material joining the opposite end sides 603 so that the reed switch leads 109 would not be electrically shorted together.

Thus, an inexpensive receptacle, for handling, stabilizing, mounting and buffering the hermetic seal of a reed switch has been described.

I claim:

1. An apparatus which mounts an electrical component on a surface of a nonconductive substrate having a conductive circuit disposed thereon, the electrical component having a body and at least a first and a second lead exiting the body to be coupled to the conductive circuit, the apparatus comprising:

a receptacle having a first side, a second side and a third side which define a volume of space for at least partially encompassing the electrical component, said first side disposed essentially opposite and parallel to said second side, said first side disposed essentially perpendicularly between said first side and said second side, said first side and said second side having at least a first surface and a second surface, respectively, disposed essentially opposite and parallel said third sale;

a first aperture disposed through said first side including said first surface and having a portion of the first lead disposed therein;

a second aperture disposed through said second side including said second surface and having a portion of the second lead disposed therein;

at least a portion of the first and the second side being deformed, responsive to the application of an energy source means, to capture said portion of the first lead and said portion of the second lead within said first and said second apertures, respectively, thereby buffering stress induced on the first and the second leads; and means, including said first surface and said second surface, for stabilizing the receptacle on the substrate.

2. An apparatus in accordance with claim 1 wherein said receptacle further comprises an opaque material.

3. An apparatus in accordance with claim 1 wherein said receptacle further comprises a first and a second edge disposed at the junction of said third side with said first side and said second side, respectively.

4. An apparatus in accordance with claim 1 wherein said third side further comprises an essentially smooth surface.

5. An apparatus in accordance with claim 1 further comprising an electrically conductive layer integrally disposed on at least a portion of said first and said second side at least partially surrounding said first and said second aperture, respectively, and extending to at least a portion of said first and said second surface, respectively.

6. An apparatus in accordance with claim 5 wherein the electrically conductive layer is integrally disposed on at least a portion of a surface of said first and said second apertures and extending to at least a portion of said first and said second surfaces.

7. An apparatus which mounts a reed switch on a surface of a nonconductive substrate having a conductive circuit disposed thereon, the reed switch having a body and having at least a first and a second lead exiting the body to be coupled to the conductive circuit, the apparatus comprising:
   a hollow receptacle, having a predetermined thickness, defining a volume of space for at least partially encompassing the body;
   a first aperture disposed through said predetermined thickness and having a portion of the first lead disposed therein;
   a second aperture disposed through said predetermined thickness and having a portion of the second lead disposed therein;
   at least a portion of the first and the second side being deformed, responsive to the application of an energy source means, to capture said portion of the first lead and said portion of the second lead within said first and said second apertures, respectively, thereby buffering stress induced on the first and the second leads; and
   means, including a first a said second surface of said receptacle, for stabilizing said receptacle on the substrate.

8. An apparatus in accordance with claim 7 wherein said receptacle further comprises an opaque material.

9. An apparatus in accordance with claim 7 wherein said receptacle further comprises a first side, a second side and a third side which define a volume of space for encompassing the electrical component, said first side disposed essentially opposite and parallel to said second side, said third side disposed essentially perpendicularly between said first side and said second side, said first side and said second side having said first and said second surface, respectively, disposed essentially opposite and parallel to said third side.

10. An apparatus in accordance with claim 7 wherein at least a portion of said receptacle further comprises an essentially smooth surface.

11. An apparatus in accordance with claim 7 further comprising an electrically conductive layer integrally disposed on at least a portion of a first and a second side of said receptacle at least partially surrounding said first and said second apertures, respectively.

12. An apparatus in accordance with claim 11 wherein the electrically conductive layer is integrally disposed on at least a portion of a surface of said first and said second apertures.

13. An apparatus for buffering stress induced on an end of at least one lead exiting a body of a component, the apparatus comprising:
   a hollow receptacle defining a volume of space for at least partially encompassing the body and having at least one side of a predetermined thickness;
   an aperture disposed through said predetermined thickness and having a portion of the lead between the end and the body disposed therein; and
   at least a portion of the one side being deformed, responsive to the application of an energy source means, to capture said portion of the lead within said aperture thereby buffering stress induced on the end of the at least one lead.

* * * * *

UNITED STATES PATENT AND TRADEMARK OFFICE
CERTIFICATE OF CORRECTION

PATENT NO.   :   5,128,834
DATED        :   Jul. 7, 1992
INVENTOR(S)  :   Kevin D. Kaschke It is certified that error appears in the above-identified patent and that said Letters Patent is hereby corrected as shown below:

In column 8, line 31, replace the word "first" with the word "third".

In column 8, line 36, replace the word "sale" with the word "side".

Signed and Sealed this

Twenty-fourth Day of August, 1993

Attest:

BRUCE LEHMAN

Attesting Officer           Commissioner of Patents and Trademarks